United States Patent
Nguyen et al.

(10) Patent No.: US 9,001,552 B1
(45) Date of Patent: Apr. 7, 2015

(54) PROGRAMMING A RRAM METHOD AND APPARATUS

(75) Inventors: Sang Thanh Nguyen, Union City, CA (US); Hagop Nazarian, San Jose, CA (US); Layne Armijo, Los Gatos, CA (US)

(73) Assignee: Crossbar, Inc., Santa Clara, CA (US)

( * ) Notice: Subject to any disclaimer, the term of this patent is extended or adjusted under 35 U.S.C. 154(b) by 267 days.

(21) Appl. No.: 13/531,449

(22) Filed: Jun. 22, 2012

(51) Int. Cl.
  *G11C 11/00* (2006.01)
  *G11C 11/404* (2006.01)

(52) U.S. Cl.
  CPC .................................. *G11C 11/4045* (2013.01)

(58) Field of Classification Search
  CPC .......................... G11C 13/0069; G11C 13/003
  USPC ..................................... 365/148, 189.16, 194
  See application file for complete search history.

(56) References Cited

U.S. PATENT DOCUMENTS

| | | |
|---|---|---|
| 5,499,208 A | 3/1996 | Shoji |
| 5,673,223 A | 9/1997 | Park |
| 5,923,587 A | 7/1999 | Choi |
| 6,002,268 A | 12/1999 | Sasaki et al. |
| 6,181,587 B1 | 1/2001 | Kuramoto et al. |
| 6,731,535 B1 | 5/2004 | Ooishi et al. |
| 6,867,618 B2 | 3/2005 | Li et al. |
| 6,897,519 B1 | 5/2005 | Dosluoglu |
| 7,167,387 B2 | 1/2007 | Sugita et al. |
| 7,251,152 B2 | 7/2007 | Roehr |
| 7,274,587 B2 | 9/2007 | Yasuda |
| 7,345,907 B2 | 3/2008 | Scheuerlein |
| 7,515,454 B2 | 4/2009 | Symanczyk |
| 7,561,461 B2 | 7/2009 | Nagai et al. |
| 7,606,059 B2 | 10/2009 | Toda |
| 7,692,959 B2 | 4/2010 | Krusin-Elbaum et al. |
| 7,746,696 B1 | 6/2010 | Paak |
| 7,764,536 B2 | 7/2010 | Luo et al. |
| 7,869,253 B2 | 1/2011 | Liaw et al. |
| 8,054,679 B2 | 11/2011 | Nakai et al. |
| 8,102,018 B2 | 1/2012 | Bertin et al. |
| 8,243,542 B2 | 8/2012 | Bae et al. |
| 8,315,079 B2 | 11/2012 | Kuo et al. |
| 8,456,892 B2 | 6/2013 | Yasuda |

(Continued)

FOREIGN PATENT DOCUMENTS

| | | |
|---|---|---|
| EP | 1096465 A2 | 2/2001 |
| KR | 10-2009-0051206 A | 5/2009 |

OTHER PUBLICATIONS

Office Action for U.S. Appl. No. 12/900,232 dated Jul. 30, 2012.

(Continued)

*Primary Examiner* — Vu Le
(74) *Attorney, Agent, or Firm* — Ogawa P.C.

(57) ABSTRACT

A circuit for programming a resistive switching device includes a resistive switching device characterized by a programmable resistance, the resistive switching device comprising a first terminal, a second terminal, and a resistive switching element, a first circuit configured to supply a programming voltage to the resistive switching device and to supply a predetermined current to flow in the resistive switching device, and a second circuit coupled to the first circuit and to the resistive switching device, wherein the second circuit is configured to terminate the supply of the programming voltage to the resistive switching device when the predetermined current flows in the resistive switching device.

20 Claims, 5 Drawing Sheets

(56) References Cited

U.S. PATENT DOCUMENTS

| | | |
|---|---|---|
| 8,467,226 B2 | 6/2013 | Bedeschi et al. |
| 2003/0036238 A1 | 2/2003 | Toet et al. |
| 2004/0170040 A1 | 9/2004 | Rinerson et al. |
| 2007/0133250 A1* | 6/2007 | Kim .............................. 365/113 |
| 2008/0043521 A1 | 2/2008 | Liaw et al. |
| 2009/0091981 A1 | 4/2009 | Park et al. |
| 2009/0251941 A1 | 10/2009 | Saito |
| 2010/0039136 A1 | 2/2010 | Chua-Eoan et al. |
| 2010/0067279 A1 | 3/2010 | Choi |
| 2010/0102290 A1 | 4/2010 | Lu et al. |
| 2010/0110767 A1 | 5/2010 | Katoh et al. |
| 2010/0171086 A1 | 7/2010 | Lung et al. |
| 2010/0182821 A1 | 7/2010 | Muraoka et al. |
| 2011/0063888 A1 | 3/2011 | Chi et al. |
| 2011/0066878 A1 | 3/2011 | Hosono et al. |
| 2011/0122679 A1 | 5/2011 | Chen et al. |
| 2011/0205780 A1 | 8/2011 | Yasuda et al. |
| 2012/0074507 A1 | 3/2012 | Jo et al. |
| 2012/0091420 A1 | 4/2012 | Kusai et al. |
| 2012/0120712 A1 | 5/2012 | Kawai et al. |
| 2012/0218807 A1 | 8/2012 | Johnson |
| 2012/0320660 A1* | 12/2012 | Nazarian et al. .............. 365/148 |
| 2013/0134379 A1 | 5/2013 | Lu |
| 2013/0235648 A1 | 9/2013 | Kim et al. |

OTHER PUBLICATIONS

Notice of Allowance for U.S. Appl. No. 13/051,296 dated Aug. 31, 2012.
Notice of Allowance for U.S. Appl. No. 12/900,232 dated Sep. 18, 2012.
Notice of Allowance for U.S. Appl. No. 12/815,318 dated Nov. 29, 2012.
International Search Report and Written Opinion for PCT/US2012/044077 filed on Jun. 25, 2012.
Office Action for U.S. Appl. No. 13/651,169 dated Mar. 7, 2013.
Office Action for U.S. Appl. No. 13/174,077 dated Apr. 1, 2013.
Office Action for U.S. Appl. No. 13/764,710 dated Aug. 9, 2013.
Notice of Allowance for U.S. Appl. No. 13/481,696 dated Sep. 30, 2013.
International Search Report and Written Opinion for PCT/US2013/042746 filed on May 24, 2013.
Notice of Allowability for U.S. Appl. No. 13/651,169 dated Oct. 28, 2013.
Notice of Allowance for U.S. Appl. No. 13/194,500 dated Oct. 28, 2013.
Office Action for U.S. Appl. No. 13/194,479 dated Sep. 25, 2013.
Liu, Ming et al., "rFGA: CMOS-Nano Hybrid FPGA Using RRAM Components", IEEE International Symposium on Nanoscale Architectures, Jun. 12-13, 2008, pp. 93-98, Anaheim, USA.
Office Action for U.S. Appl. No. 13/525,096, dated Dec. 27, 2013.
Office Action for U.S. Appl. No. 13/174,077 dated Feb. 13, 2014.
Office Action and List of References for U.S. Appl. No. 12/815,318 dated May 16, 2012 from the United States Patent and Trademark Office.
International Search Report for PCT/US2011/046036 filed on Jul. 29, 2011.
Written Opinion of the International Searching Authority for PCT/US2011/046036 filed on Jul. 29, 2011.

\* cited by examiner

PROGRAMMING A RRAM METHOD AND APPARATUS

BACKGROUND

The present disclosure is related to resistive switching device or an RRAM. More particularly, embodiments according to the present invention provide a circuitry and an associated method to program a resistive switching device. But it should be recognized that embodiments according to the present invention can have a much broader range of applicability.

The inventor of the present invention has recognized the success of semiconductor devices has been mainly driven by an intensive transistor down-scaling process. However, as field effect transistors (FETs) approach sizes less than 100 nm, physical problems such as short channel effect begin to hinder proper device operation. For transistor based memories, such as those commonly known as Flash memories, other performance degradations or problems may occur as device sizes shrink. With Flash memories, a high voltage is usually required for programming of such memories, however, as device sizes shrink, the high programming voltage can result in dielectric breakdown and other problems. Similar problems can occur with other types of non-volatile memory devices other than Flash memories.

The inventor of the present invention recognizes that many other types of non-volatile random access memory (RAM) devices have been explored as next generation memory devices, such as: ferroelectric RAM (Fe RAM); magneto-resistive RAM (MRAM); organic RAM (ORAM); phase change RAM (PCRAM); and others.

A common drawback with these memory devices include that they often require new materials that are incompatible with typical CMOS manufacturing. As an example of this, Organic RAM or ORAM requires organic chemicals that are currently incompatible with large volume silicon-based fabrication techniques and foundries. As another example of this, Fe-RAM and MRAM devices typically require materials using a high temperature anneal step, and thus such devices cannot be normally be incorporated with large volume silicon-based fabrication techniques.

Additional drawbacks with these devices include that such memory cells often lack one or more key attributes required of non-volatile memories. As an example of this, Fe-RAM and MRAM devices typically have fast switching (e.g. "0" to "1") characteristics and good programming endurance. However, such memory cells are difficult to scale to small sizes. In another example of this, for ORAM devices reliability of such memories is often poor. As yet another example of this, switching of PCRAM devices typically includes Joules heating and undesirably requires high power consumption.

The inventors of the present invention have recognized that programming of RRAM devices should be performed under controlled conditions. If too much current is applied across the terminals of an RRAM device, the RRAM device may be irreversibly programmed, and the RRAM device may not be erasable.

From the above, an improved semiconductor device architecture is desirable. RRAM devices utilizes the programmability of electrical resistance of a non-conductive material configured in a cross point of a pair of electrodes. In a simplest way, an RRAM cell can be programmed to be in a high resistance state and a low resistance state though multilevel cells have been reported. In continuing pursuit of device shrink, RRAM provides a feature size that can be further scaled down by ways of vertical integration.

BRIEF SUMMARY OF THE PRESENT INVENTION

Embodiments according to the present invention are related to resistive switching device. More particularly, embodiments according to the present invention provide a circuitry and method for programming a resistive switching device. The present circuitry and the associated method provide means to control a current flow in the device during programming. Such control stops a programming voltage applied to the device once a desirable device resistance is achieved thus preventing damage to the device.

In a specific embodiment, a circuitry for programming a resistive switching device is provided. The circuit includes a resistive switching device characterized by a programmable resistance. In a specific embodiment, the resistive switching device includes a first terminal, a second terminal, and a resistive switching element configured in an intersection region of the first terminal and the second terminal. The circuit includes a first circuit configured to supply a programming voltage to the resistive switching device and to cause a predetermined current to flow in the resistive switching device. The circuit also includes a second circuit operably coupled to the first circuit and the resistive switching device configured to terminate supplying the programming voltage to the resistive switching device when the predetermined current flows in the resistive switching device.

In a specific embodiment, a method for programming a resistive switching device is provided. The method includes providing a resistive switching device comprising a first terminal, a second terminal, and a resistive switching element configured having a programmable electrical resistance between the first terminal and the second terminal. The method includes applying a programming voltage supplied from a voltage source to the first terminal to cause a first current to flow in the resistive switching device. In a specific embodiment, the method terminates the first current flowing into the resistive switching device when the first current is no less than a predetermined current.

Many benefits can be achieved by ways of the present invention. As electrical resistance of a resistive switching device changes suddenly when voltage greater than a threshold voltage is applied, current flow needs to be controlled to prevent damage to the device due to joule heating and breakdown. The present programming circuit and associated programming method provide a precise current compliance for the resistive switching device. Additionally, the present circuitry further includes circuitries to allow parasitic capacitance in the interconnects to be inhibited, further improve the performance of the device. Depending on the embodiment. One or more of these benefits may be achieved.

SUMMARY OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which.

DETAILED DESCRIPTION OF THE PRESENT INVENTION

Embodiments according to the present invention are related to resistive switching device. More particularly, embodiments according to the present invention provide a circuitry and method for programming a resistive switching device. The present circuitry and the associated method provide means to control a current flow in the device during programming. Such control stops a programming voltage applied to the device once a desirable device resistance is achieved thus preventing damage to the device.

Figure 1:
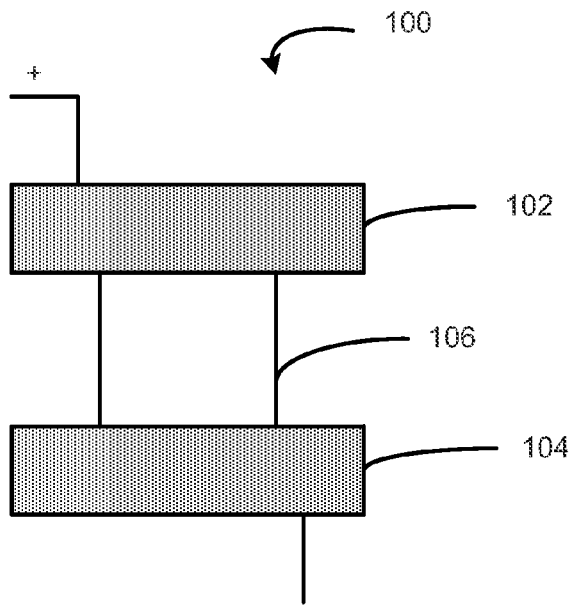
FIG. 1 is a simplified diagram illustrating a resistive switching device according to various embodiment of the present invention.

FIG. 1 is a simplified diagram illustrating a resistive switching device 100 according to an embodiment of the present invention. As shown, resistive switching device 100 includes a first electrode 102, a second electrode 104 and a resistive switching material 106 disposed in an intersection of first electrode 102 and second electrode 104. The resistive switching material is characterized by a programmable resistance depending on an operating voltage applied to the electrodes. The resistance change is caused by at least a conductive path derived from electrode 102 formed in resistive switching material 106 upon application of a electric field. The conductive path causes an electric current to flow in the resistive switching device.

Figure 2:
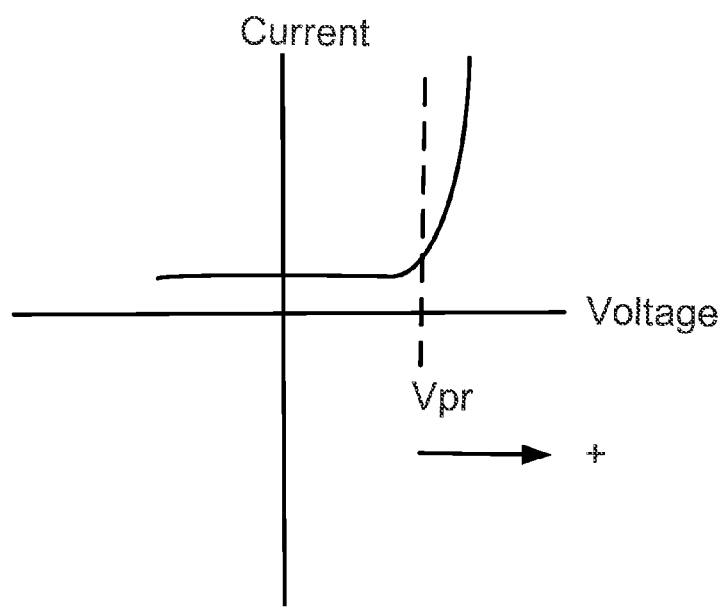
FIG. 2 is an exemplified diagram illustrating a current-voltage (IV) characteristic of the resistive switching device according to various embodiments of the present invention.

FIG. 2 is a simplified diagram illustrating a current-voltage (I-V) characteristic during programming of a resistive switching device. As shown, in an off state, no current or very low current flows in the device. As shown, electrical resistance of the device is reduced rather abruptly when threshold voltage Vpr is applied and an on-state current flows in the device and the device is in a low resistance state. As the change from a high resistance state to a low resistance state is sudden, it is imperative that a current control mechanism is provided so as not to damage the device due to Joule heating, and others. For proper operation of the resistive switching device, an optimized current after programming is desired, as too high a current would damage the device and too low an on-state current would compromise retention characteristic. Accordingly, embodiments according to the present invention provide a circuitry and a method to control current flowing in the device during programming. The circuitry provides a suitable voltage to cause a pre-determined current to flow and terminates the voltage applied to the resistive switching device once the pre-determined current is attained.

Figure 3:
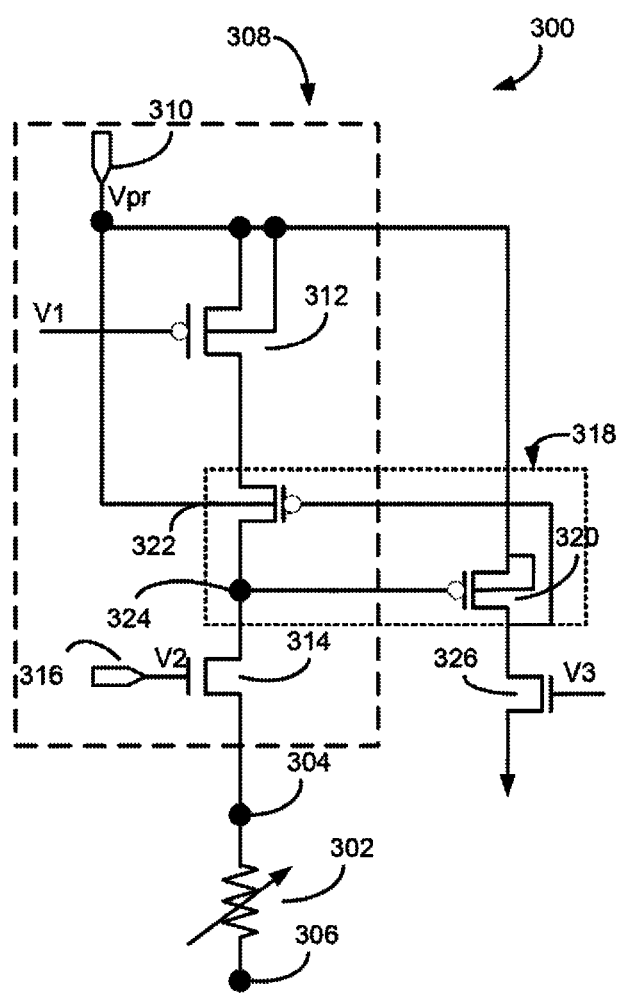
FIG. 3 illustrates a programming circuitry configured to cause the resistive switching device to change from a high resistive state to a low resistive according to various embodiments of the present invention.

FIG. 3 illustrates an exemplified circuit 300 for programming a resistive switching device 302 according to various embodiments of the present invention. As shown, resistive switching device 302 includes a first terminal 304 and a second terminal 306. Further, resistive switching device 302 is characterized by a resistance depending on a voltage applied.

As shown, circuit 300 includes a first circuitry 308. First circuitry 308 is configured to provide a programming voltage including a voltage profile to cause the resistive switching device to change from a high resistance state to a low resistance state. As shown, first circuitry 308 includes a voltage source 310. Voltage source 310 provides a voltage having a magnitude no less than the programming voltage Vpr for resistive switching device 302. As merely an example, for a resistive switching device having an amorphous silicon material as the switching material and silver as at least part of the first electrode, the programming voltage can range from about 1 volt to about 8 volts depending on the device size and others.

As shown, first circuitry 308 includes a first PMOS transistor 312 having a first gate, a first source region and a first drain region. The first source region is connected to voltage source 310. First PMOS transistor 312 is configured to allow a predetermined current to flow. In certain application, the predetermined current can be a current compliance for resistive switching device 302. In certain implementation, a first voltage V1 is applied to a first gate of first PMOS transistor 312. A voltage difference between the programming voltage Vpr from the voltage source 310 and the first voltage V1 determines the predetermined current or the current compliance for resistive switching device 302. As shown, program circuitry 300 includes a second PMOS transistor 322 serially connected to first PMOS transistor 312. A first NMOS transistor 314 is operably coupled to second PMOS transistor 322. First NMOS transistor 314 is connected to a second voltage source 316 and configured to be a voltage enable, that is, to allow the predetermined voltage from the voltage source 310 to be delivered to resistive switching device 302. The voltage enabler can be configured to provide various voltage profiles such as a voltage pulse, a voltage ramp, or a constant voltage, and others, depending on the implementation. As shown, second PMOS transistor 322 is configured interposing first PMOS transistor 312 and first NMOS transistor 314, and functions as a voltage switch for the programming circuit.

Referring again to FIG. 3. Programming circuit 300 further includes a second circuitry 318 configured to stop or terminate programming of resistive switching device 302 once the predetermined current flows in the resistive switching device. Terminating circuit 318 includes a third PMOS transistor 320 coupled to second PMOS transistor 322. Second PMOS transistor includes source region sharing a common node 324 with a gate of third PMOS transistor 320 and a drain region of first NMOS transistor 314. Third PMOS transistor 320 includes a drain region connected to a current bias provided by a second NMOS transistor 326. The drain region of third PMOS transistor 320 is connected to the gate of second PMOS transistor 322.

Figure 4:
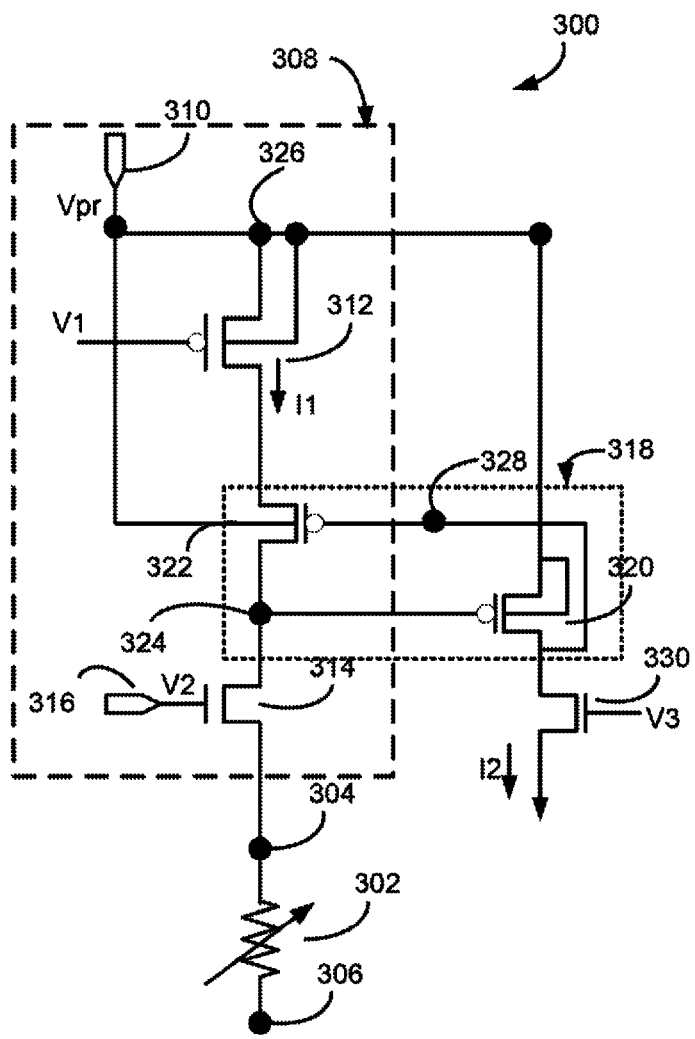
FIG. 4 is a simplified diagram illustrating a method of programming the resistive switching device according to various embodiment of the present invention.

Referring to FIG. 4, a programming method of resistive switching device 302 is illustrated. As shown, resistive switching device 302 is provided at a high resistance state and an off state current flows in device 302. Off state current is usually low and in a pico ampere range. Voltage source 310 supplies a programming voltage Vpr. An adequate bias between voltage V1 applied to the gate of first transistor 312 and Vpr determines a predetermined current I1 flowing in first transistor 312. Pre-determined current I1 can be a current compliance for resistive switching device 302 in certain implementation. As shown, when an enabling voltage V2 (for example, a voltage pulse) is applied to the gate of first NMOS transistor 314, the predetermined current I1 flows into resistive switching device 302 in the duration of enabling voltage V2. The resistive switching device 302 starts to draw current until a current about the applied predetermined current I1 flows in the resistive switching device. The voltage at first terminal 304 drops and node 324 is pulled down to a low voltage, which causes third PMOS transistor 320 to turn on. A second current I2 is applied to a source region of third PMOS transistor 320. Once third PMOS transistor 320 is conductive, current I2 flows in third PMOS transistor 320. Current I2 pulls up node 328 to a voltage high enough to cause the gate of second PMOS transistor 322 to be in a high voltage, deactivating second PMOS transistor 322 and turns off current I1 flows into the resistive switching device 302. Accordingly, once the current flows in resistive switching device reaches about predetermined first current I1, current stops flowing in second PMOS transistor 322 and resistive switching device 302. Second PMOS 322 functions as a switch to allow the predetermined current I1 to flow in the resistive switching device 302 during programming and to terminate programming when the predetermined current is flowing in resistive switching device 302 or the current compliance is reached. This ensures that the current flows in the resistive switching device would not exceed the pre-determined current I1.

Figure 5:
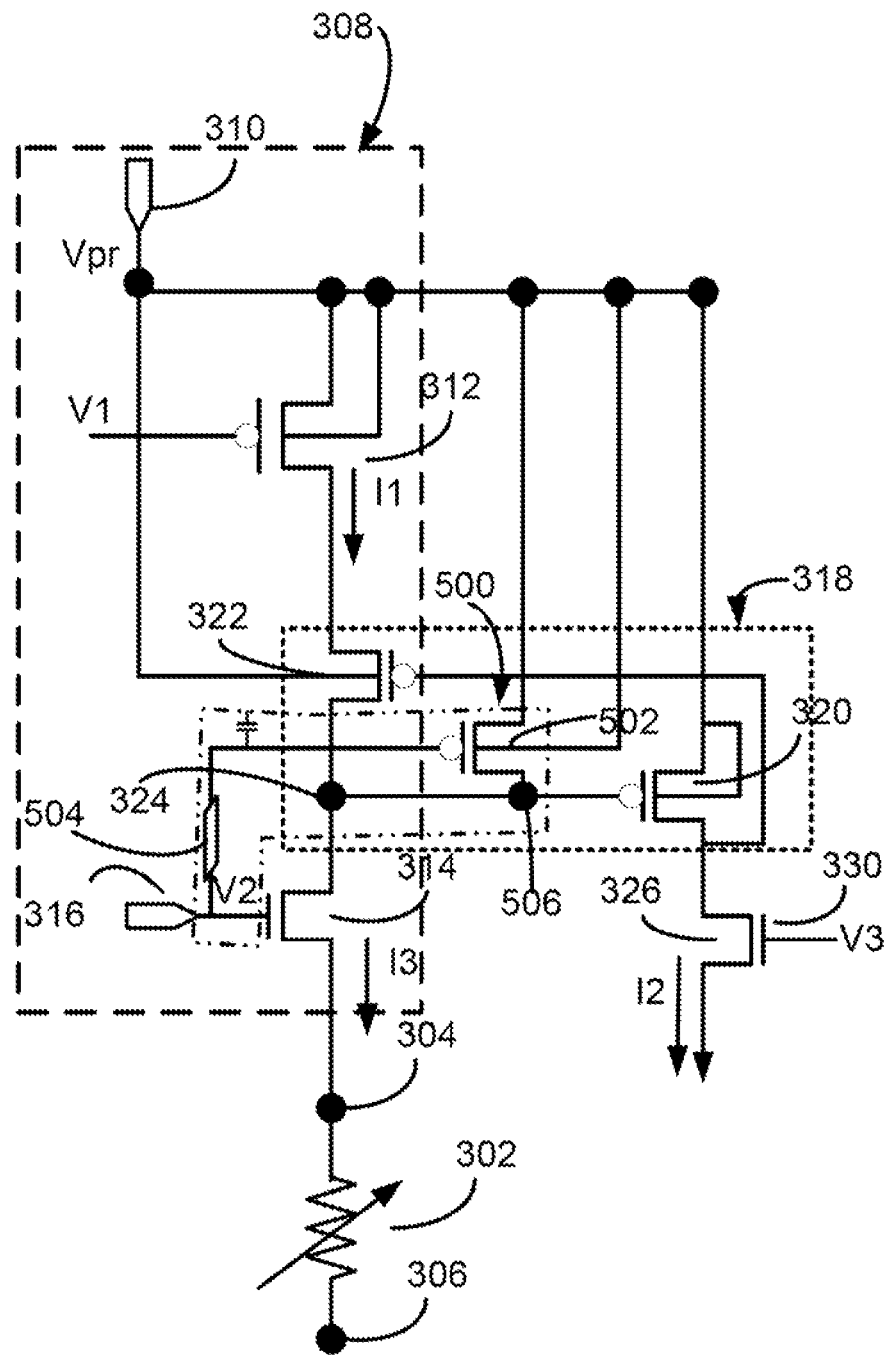
FIG. 5 is a simplified diagram illustrating a programming circuitry for the resistive switching device according to an alternative embodiment of the present invention.

Referring to FIG. 5. Depending on the implementation, there can be other variations to further improve programming of the resistive switching device. For example, interconnects usually carry certain capacitance and can interfere with programming of the resistive switching device. Merely by ways of illustration, capacitance in various connections to resistive switching device 302 may cause a delay in an onset of the voltage at resistive switching device 302. A graphical representation of voltage profile as experienced by the resistive switching device 302 is shown in FIG. 6.

Referring again to FIG. 5. A parasitic current I3 due to albeit small can flow before programming is initiated in resistive switching device 302. This small current I3 may also pull down the voltage at node 324 sufficiently low to trigger terminating circuit to turn off second PMOS transistor 322. As shown in FIG. 5, a third circuitry 500 configured to cause a delay in applying voltage V2 from voltage enabler 316 is provided. Third circuitry 500 includes a delay element 504 coupled to voltage enabler 316. Delay element 504 can be a resistor element or a combination of resistor and capacitance (RC) depending on the application. Third circuitry 500 further includes a fourth PMOS transistor 502 provided between delay element 504 and voltage source 310. Fourth PMOS transistor 502 includes a gate connected to delay element 504, a source region connected to common node 324, and a drain region connected to voltage source 310. Fourth PMOS transistor 502 is configured to maintain node 324 to be at a high voltage preferably at about the same voltage as the voltage supply 310 and maintains the gate associated with PMOS transistor 320 to be at high voltage and therefore non-conductive. This allows terminating circuit 318 to be triggered only when node 324 is pulled down only when I1 flows in resistive switching device 302 as a result of the resistive switching device is programmed and not due to current I3.

Figure 6:
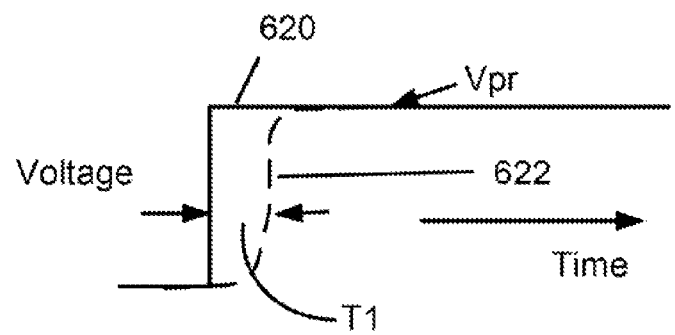
FIG. 6 is a voltage diagram according to various embodiments of the present invention.

Referring to FIG. 6, a voltage profile 620 corresponding to a voltage pulse as generated by the voltage enabler 316 is shown. As resistive switching device 302 is in a high resistance state before programming, parasitic capacitance in various interconnects to resistive switching device 302, initiation of the voltage across resistive switching device 302 is delayed by a time interval T1, and a voltage profile 622 is experienced by resistive switching device 302. Moreover, due to variation between devices, T1 for different devices may not be the same.

Figure 7:
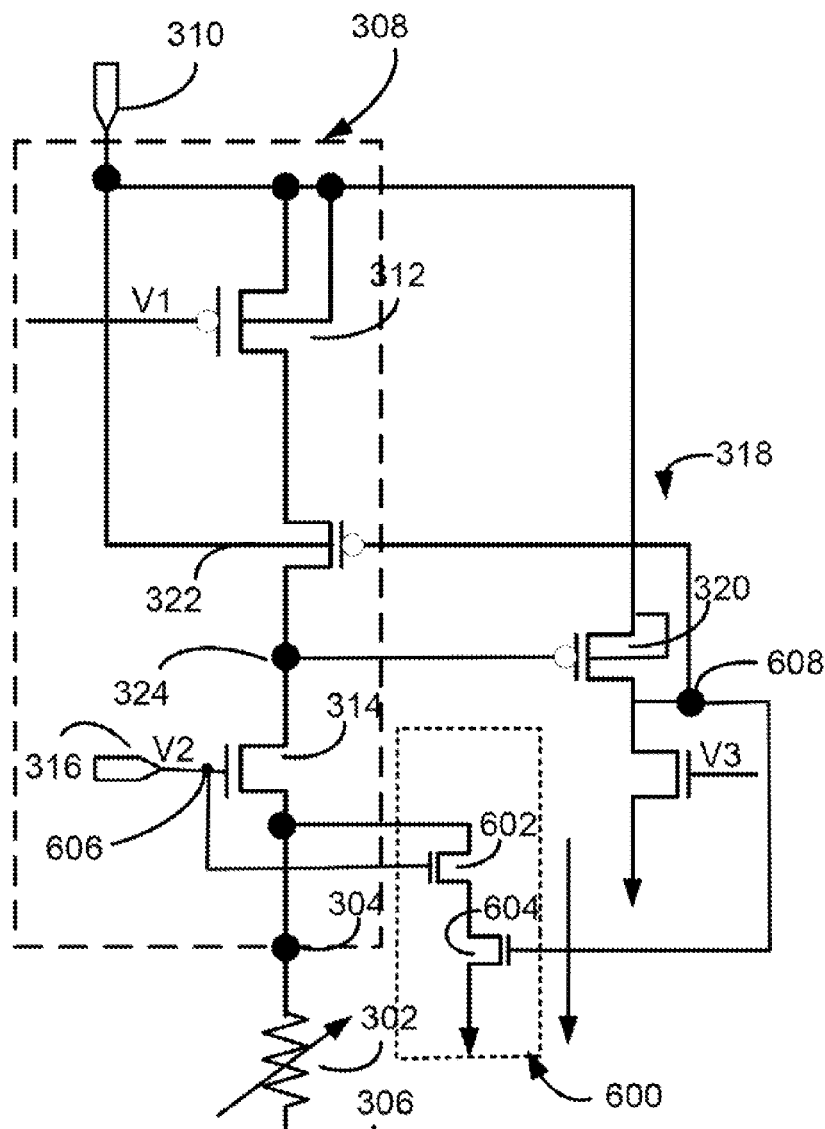
FIG. 7 is a simplified diagram illustrating a programming circuitry for the resistive switching device according to yet an alternative embodiment of the present invention.

Referring to FIG. 7, to ensure that resistive switching device 302 is programmed and the desired on-state current, a fourth circuit 600 is provided. Fourth circuit 600 is further configured to ensure that after the predetermined current I1 flows in resistive switching device 302, second circuit 318 is triggered and programming is terminated. Fourth circuit 600 includes a third NMOS transistor 602 and a fourth NMOS transistor 604. Third NMOS transistor 602 includes a sixth drain region connected to the second drain region of first NMOS transistor 314 and a sixth gate connected to a node 606 common to the voltage profile generator and the second gate of first NMOS transistor 314. Fourth NMOS transistor 604 includes a seventh gate connected to a common node 608 shared by the source region of third transistor 320 and second gate of second PMOS transistor 322. When the voltage profile is on, third NMOS transistor 602 is conductive but fourth NMOS transistor 604 remain non-conductive. As the gate of fourth NMOS transistor 604 is connected at least to the gate of second PMOS transistor 322, as long as fourth NMOS transistor 604 remains non-conductive, second PMOS transistor 322 would be conductive, until the predetermined current I1 flows in the resistive switching device 302, which triggers second circuitry 318 and current ceases to flow in second transistor 322. Since node 608 is connected to gate of second PMOS transistor 322, node 608 is now pulled high and causes fourth NMOS transistor to be conductive and current excessive of the pre-determined current (or current compliance) would be allow to flow in path 606 through third NMOS transistor 602 and fourth NMOS transistor 604 and be dissipated.

Further embodiments can be envisioned to one of ordinary skill in the art after reading this disclosure. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention. As an example additional circuits, such as read and erase circuitries and others are to be included for operation of the device.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A circuit coupled to a voltage source for programming a resistive switching device, comprising:
   a resistive switching device characterized by a programmable resistance, the resistive switching device comprising a first terminal, a second terminal, and a resistive switching element;
   a first circuit coupled to the voltage source, wherein the first circuit is configured to supply a programming voltage to the resistive switching device and to supply a predetermined current to flow in the resistive switching device in response to a voltage supplied by the voltage source; and
   a second circuit coupled to the first circuit and to the resistive switching device, wherein the second circuit is configured to terminate the supply of the programming voltage to the resistive switching device when the predetermined current flows in the resistive switching device, wherein the second circuit comprises a pair of cross-coupled PMOS transistors.

2. The circuit of claim 1 wherein the pair of cross-coupled transistors comprises a first PMOS transistor and a second PMOS transistor, wherein a gate of the first PMOS transistor is coupled to a source of the second PMOS transistor, wherein the gate of the second PMOS transistor is coupled to a common node with the source of the first PMOS transistor.

3. The circuit of claim 2 wherein the first circuit comprises a third PMOS transistor, wherein a drain of the third PMOS transistor is coupled to the voltage source, and wherein a source of the third PMOS transistor is coupled to the drain of the first PMOS transistor.

4. The circuit of claim 2
wherein the first terminal of the resistive switching device is coupled to the common node.

5. The circuit of claim 2 further comprising a transistor coupled to the common node and to the first terminal of the resistive switching device, wherein the transistor is configured to selectively couple the first terminal of the resistive switching device to the common node in response to a voltage applied to a gate of the transistor.

6. The circuit of claim 1
wherein the predetermined current is responsive to a voltage difference between the programming voltage and a voltage applied to a first gate of the third PMOS transistor.

7. The circuit of claim 1 wherein the resistive switching device also comprises an active metal material layer;
wherein the active metal material layer is coupled to the first terminal and to resistive switching element; and
wherein the resistive switching element is coupled to the second terminal.

8. The circuit of claim 1 further comprising a voltage profile generator operably coupled to the voltage source, wherein the voltage profile generator is configured to provide a voltage profile to the programming voltage.

9. The circuit of claim 8 wherein the voltage profile is selected from a group consisting of: voltage pulse, a voltage ramp, and a constant voltage.

10. The circuit of claim 8 wherein the voltage source is configured to provide the programming voltage, wherein the programming voltage has an amplitude within a range of about 1 volt to about 8 volts.

11. The circuit of claim 7 wherein the resistive switching element comprises amorphous silicon material, and
wherein the active metal material layer comprises a silver metal material.

12. A method of programming a resistive switching device, comprising:
providing a resistive switching device comprising a first electrode, a second electrode, and a resistive switching element characterized by a programmable electrical resistance between the first electrode and the second terminal;
applying a programming voltage from a voltage source to the first electrode to cause a first current to flow in the resistive switching device comprising:
activating a first PMOS transistor having a drain coupled to the voltage source; and
switching a pair of cross-coupled PMOS transistors coupled to a source of the first PMOS transistor and to the first electrode of the resistive switching element to provide the programming voltage to the first terminal of the resistive switching device; and
terminating the first current flowing into the resistive switching device when the first current is not less than a predetermined current comprising:
determining when the first current is not less than the predetermined current; and
switching the pair of cross-coupled PMOS transistors to terminate providing the programming voltage to the first terminal of the resistive switching device in response to determining the first current is not less than the predetermined current.

13. The method of claim 12 further comprises coupling the second electrode of the resistive switching device to ground.

14. The method of claim 12 wherein the predetermined current is provided by a voltage difference between a voltage applied to a gate of the first PMOS transistor and the programming voltage from the voltage source.

15. The method of claim 12 wherein applying the programming voltage comprises activating a second PMOS transistor from the pair of cross-coupled PMOS transistors that is serially connected to the first PMOS transistor.

16. The method of claim 15
wherein terminating the programming voltage comprises deactivating the second PMOS transistor from the pair of cross-coupled PMOS transistors that is serially connected to the first PMOS transistor.

17. The method of claim 16 wherein deactivating the second PMOS transistor comprises:
activating a third PMOS transistor from the pair of cross-coupled PMOS transistors; and thereafter
coupling a gate of the second PMOS transistor to the programming voltage in response to activating the third PMOS transistor.

18. The method of claim 15 wherein activating the second PMOS transistor further comprises applying the programming voltage to a third PMOS transistor from the pair of cross-coupled PMOS transistors to thereby deactivate the third PMOS transistor.

19. The method of claim 12 wherein applying the programming voltage from the voltage source to the first electrode further comprises delaying providing the programming voltage to the first terminal of the resistive switching device with a delay circuit.

20. The method of claim 12 wherein the programming voltage is within a range of about 1 volt to about 8 volts.

* * * * *